United States Patent
Yamaguchi et al.

(10) Patent No.: US 12,109,955 B2
(45) Date of Patent: Oct. 8, 2024

(54) ELECTRICAL CIRCUIT BOARD

(71) Applicant: YAZAKI CORPORATION, Tokyo (JP)

(72) Inventors: Hayato Yamaguchi, Makinohara (JP); Sadaharu Okuda, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 374 days.

(21) Appl. No.: 17/841,289

(22) Filed: Jun. 15, 2022

(65) Prior Publication Data

US 2023/0001867 A1 Jan. 5, 2023

(30) Foreign Application Priority Data

Jul. 5, 2021 (JP) ................................. 2021-111758

(51) Int. Cl.
*B60R 16/023* (2006.01)
*B60L 3/04* (2006.01)
*H05K 1/02* (2006.01)
*H05K 5/00* (2006.01)

(52) U.S. Cl.
CPC .............. *B60R 16/023* (2013.01); *B60L 3/04* (2013.01); *H05K 1/0295* (2013.01); *H05K 5/0026* (2013.01); *B60L 2210/10* (2013.01)

(58) Field of Classification Search
CPC ............ B60R 16/0207; B60R 16/0215; B60R 16/0238; B60R 16/0239
See application file for complete search history.

(56) References Cited

U.S. PATENT DOCUMENTS

| | | |
|---|---|---|
| 5,737,190 A | 4/1998 | Marshall et al. |
| 2003/0032308 A1 | 2/2003 | Tamai et al. |
| 2014/0054959 A1 | 2/2014 | Hayashi |
| 2018/0326928 A1* | 11/2018 | Saito .................. H02G 3/16 |
| 2019/0168693 A1* | 6/2019 | Nakamura .......... B60R 16/0239 |
| 2021/0245686 A1* | 8/2021 | Suzuki .................... B60R 16/03 |
| 2022/0144192 A1 | 5/2022 | Ishihara |

FOREIGN PATENT DOCUMENTS

| | | |
|---|---|---|
| JP | 2011-76972 A | 4/2011 |
| JP | 2014-40205 A | 3/2014 |
| JP | 2018-52229 A | 4/2018 |
| JP | 2020-40504 A | 3/2020 |

* cited by examiner

*Primary Examiner* — Jared Fureman
*Assistant Examiner* — Christopher J Clark
(74) *Attorney, Agent, or Firm* — Sughrue Mion, PLLC

(57) ABSTRACT

An electrical circuit board on which an electronic component forming an electronic control unit disposed between an upstream power supply and a downstream power supply trunk line is mounted. The electrical circuit board includes a first circuit pattern that forms an electrical circuit corresponding to a single power supply voltage of the upstream power supply, a second circuit pattern that forms an electrical circuit corresponding to a plurality of power supply voltages of the upstream power supply, a single power supply connection portion corresponding to connection with an external circuit that supplies the upstream power supply, and an inter-board connection portion corresponding to inter-board connection with another circuit board that supplies the upstream power supply.

5 Claims, 6 Drawing Sheets

ELECTRICAL CIRCUIT BOARD

CROSS-REFERENCE TO RELATED APPLICATIONS

This application is based on and claims priority under 35 USC 119 from Japanese Patent Application No. 2021-111758 filed on Jul. 5, 2021, the contents of which are incorporated herein by reference.

TECHNICAL FIELD

The present invention relates to an electrical circuit board that can be used to form various electronic control units (ECUs) mounted on a vehicle, for example.

BACKGROUND ART

For example, Patent Literature 1 discloses a technique for eliminating cost increase associated with changing an ECU and a base harness according to a popular car and a luxury car or a grade of a vehicle. Specifically, a base harness 2 for a low-grade vehicle is connected to an electronic control unit 1 for the low-grade vehicle with a connector, a sub harness 5 corresponding to a high-grade vehicle is connected to the electronic control unit 1 for the low-grade vehicle together with the base harness 2 with a connector, and the sub harness 5 is connected, with a connector, to a function built-in connector 4 that is built-in with an electronic element and can perform multiplex communication. The number of electric wires of the sub harness 5 is smaller than the number of electric wires of a location sub harness 6 that is led out from the function built-in connector 4 to a load side.

In addition, Patent Literature 2 shows a technique for forming a vehicle control circuit board using a common printed board even when a correlation between a signal terminal of a microcomputer and a connection terminal of a connector differ. Specifically, the vehicle control circuit board 1 selectively includes either a first resistor element 6 mounted over a first circuit pattern 81 and a second circuit pattern 82a or a second resistor element 7a mounted on the second circuit pattern 82a. The first circuit pattern 81 is electrically connected to first signal terminals 921a and 921b of MCU 2 and a first connection terminal 511 of a connector 5. The second circuit pattern 82a is electrically connected to a second signal terminal 922a of the MCU 2 and a second connection terminal 512a of the connector 5.

CITATION LIST

Patent Literature

Patent Literature 1: JP-A-2011-76972
Patent Literature 2: JP-A-2014-40205

SUMMARY OF INVENTION

In recent vehicles, it is necessary to easily cope with Mobility as a-Service (MaaS) and CASE. MaaS is a concept for seamlessly connecting a mobile service across a plurality of transportation such as a train, a bus, and an airplane when people transfer with the transportation and move. CASE represents "connected (a vehicle connected to a net)", "autonomous (automated driving)", "shared & service (car sharing and new service)", and "electric (conversion to an electric vehicle)" in an automobile industry.

In order to cope with MaaS and CASE, it is expected that types and the number of functions mounted on the vehicle will increase significantly in the future. In addition, it is expected that the number of types of system components forming an in-vehicle function is very large depending on a grade of the vehicle and a specification difference of functions to be mounted.

Therefore, it is important for a component manufacturer that manufactures the system component for each vehicle to easily absorb an influence of the specification difference for each vehicle, to shorten a development period of each system component, and to reduce reworking of main components and an increase in the number of types. Therefore, it is necessary to develop techniques as disclosed in Patent Literature 1 and Patent Literature 2.

In recent vehicles, for the purpose of efficient use of power supply power, a plurality of power supplies may be mounted on the same vehicle, and a plurality of types of voltages such as 12 V and 48 V may be handled as power supply voltages at the same time. In addition, such a vehicle is often mounted with a DC/DC converter that steps down or steps up the power supply voltage. That is, by mounting the DC/DC converter, each device mounted on the vehicle as a load can simultaneously or selectively use a plurality of in-vehicle power supplies having different voltages.

In addition, since cost of the vehicle increases when a plurality of in-vehicle power supplies are mounted, there is a high possibility that a plurality of in-vehicle power supplies are mounted on a vehicle having a relatively high grade as described above and only a single in-vehicle power supply is mounted on a vehicle having a low grade. Therefore, in a case of manufacturing an ECU that supplies power supply power to each part of the vehicle, it is necessary to individually design and manufacture an electrical circuit that implements a function corresponding to a mixture of two types of power supply voltages and an electrical circuit that implements a function corresponding to only a single power supply voltage.

Therefore, also for a circuit board (printed board) on which an electronic component of the ECU is mounted, it is necessary to prepare a circuit board corresponding to a mixture of two types of power supply voltages and a circuit board corresponding to only the single power supply voltage as individual components. These components of the circuit boards have circuit patterns whose positions and shapes are different from each other because circuit configurations are different from each other. Further, these circuit boards are managed under different part numbers.

The present invention has been made in view of the above circumstances, and an object of the present invention is to provide an electrical circuit board capable of sharing components of a circuit board for a plurality of types of electrical circuits having different types of power supply voltages.

The object of the present invention is achieved with the following configuration.

An electrical circuit board on which an electronic component forming an electronic control unit disposed between an upstream power supply and a downstream power supply trunk line is mounted, the electrical circuit board including:
  a first circuit pattern that forms an electrical circuit corresponding to a single power supply voltage of the upstream power supply;
  a second circuit pattern that forms an electrical circuit corresponding to a plurality of power supply voltages of the upstream power supply;

a single power supply connection portion corresponding to connection with an external circuit that supplies the upstream power supply; and an inter-board connection portion corresponding to inter-board connection with another circuit board that supplies the upstream power supply.

According to the electrical circuit board of the present invention, components of the circuit board can be shared among a plurality of types of electrical circuits having different types of power supply voltages. Therefore, it is possible to reduce types and part numbers of the circuit board, and it is possible to reduce management cost. In addition, since a common circuit board can be used in a plurality of types of devices, it is possible to reduce a unit price of the circuit board by increasing a quantity. Further, it is possible to reduce development man-hours when a circuit change is required.

The present invention has been briefly described above. Further, details of the present invention will be clarified by reading a mode (hereinafter, referred to as an "embodiment") for carrying out the invention to be described below with reference to the accompanying drawings.

DESCRIPTION OF EMBODIMENTS

A specific embodiment according to the present invention will be described below with reference to the drawings.

Figure 1:
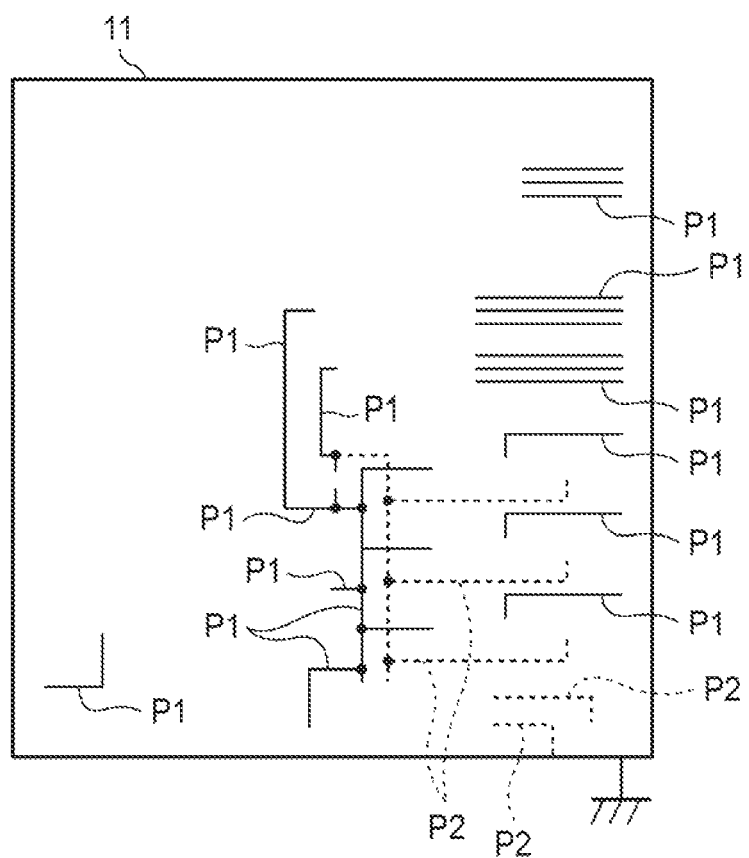
FIG. 1 is a plan view showing an outline of an electrical circuit board according to an embodiment of the present invention.

FIG. 1 is a plan view showing an outline of an electrical circuit board 11 according to the embodiment of the present invention.

The electrical circuit board 11 shown in FIG. 1 is a component formed by attaching a conductor such as a copper foil to each layer such as a front surface and a back surface of a substrate formed of an electrically insulating resin or the like, similarly to a printed board used in a general electrical circuit. In addition, the conductor of each layer forms a circuit pattern having a complicated shape so that a specific electronic circuit can be easily formed.

That is, a position, shape, thickness, and the like of each circuit pattern are designed in accordance with a configuration of the specific electronic circuit and a mounting layout of each electronic component so that electronic components mounted on each part on the electrical circuit board 11 are electrically connected to each other via the circuit pattern to form an electronic circuit that performs a predetermined function.

In the electrical circuit board 11 shown in FIG. 1, a first circuit pattern P1 indicated by a solid line and a second circuit pattern P2 indicated by a broken line are formed.

Use of the electrical circuit board 11 shown in FIG. 1 is a circuit board required to form an electrical component such as a zone ECU mounted on a vehicle. In addition, there are various types of vehicles on which zone ECUs are mounted with respect to grades and the like, and these have slightly different design specifications.

Specifically, a type of power supply that can be supplied by a vehicle side may be a single power supply having an output voltage specification of 12 V or a plurality of power supplies having output voltage specifications of 12 V and 48 V.

The electrical circuit board 11 shown in FIG. 1 is designed as a special component that can be commonly used both in a case of the single power supply having the output voltage specification of 12 V on the vehicle side and in a case of a plurality of power supplies having the output voltage specifications of 12 V and 48 V.

Specifically, the first circuit pattern P1 in the electrical circuit board 11 is used to form an electrical circuit corresponding to a case where the output voltage specification on the vehicle side is a single power supply of 12 V. In addition, the second circuit pattern P2 in the electrical circuit board 11 is used to form an electrical circuit corresponding to a case where the output voltage specifications on the vehicle side are a plurality of power supplies of 12 V and 48 V. That is, since the electrical circuit board 11 includes both the first circuit pattern P1 and the second circuit pattern P2, the electrical circuit board 11 can be used as a common component for forming a plurality of types of zone ECUs.

Configuration Example 1 of Zone ECU

Figure 2:
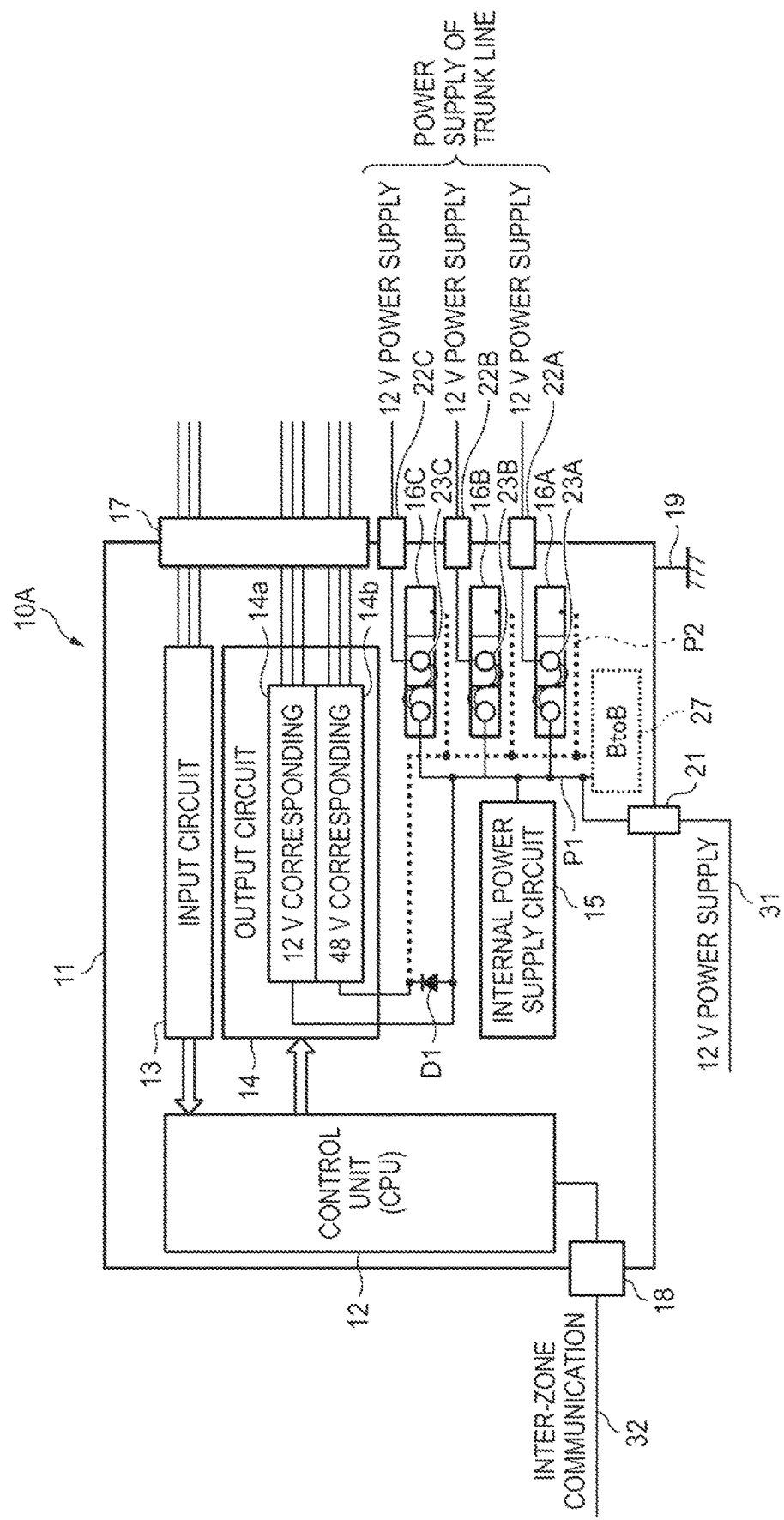
FIG. 2 is a plan view showing a configuration example of a zone ECU for a single power supply formed of the electrical circuit board.

FIG. 2 shows a configuration example of a zone ECU 10A for a single power supply formed by using the electrical circuit board 11 shown in FIG. 1. That is, the zone ECU 10A is formed by mounting various electronic components necessary for forming the zone ECU 10A on the electrical circuit board 11 and electrically connecting the electronic components to each other.

The zone ECU 10A has a function of managing various electrical components in a zone on the vehicle. Specifically, the zone ECU 10A has a function of distributing and supplying power supply power supplied from an in-vehicle power supply on an upstream side to various electrical components on a downstream side. In addition, it is also possible to switch on and off power supply for each electrical component, or to automatically adjust distribution of the power supply in accordance with a priority of each electrical component.

As shown in FIG. 2, the zone ECU 10A includes a control unit (CPU: microcomputer) 12, an input circuit 13, an output circuit 14, an internal power supply circuit 15, fuse holders 16A, 16B, and 16C, an input and output connector 17, a communication connector 18, a ground connection portion 19, and power supply output connectors 22A, 22B, and 22C.

That is, the above-described various electronic components are mounted on the electrical circuit board 11, and the respective circuits are connected to each other by soldering or the like. Predetermined fuses 23A, 23B, and 23C are mounted on the fuse holders 16A, 16B, and 16C, respectively.

In addition, as shown in FIG. 2, in addition to the first circuit pattern P1 and the second circuit pattern P2, an inter-board connection (BtoB) portion 27 is present on the electrical circuit board 11. However, since inter-board connection is not necessary in the zone ECU 10A, the inter-board connection portion 27 is in an unused state in a state of FIG. 2. In FIG. 2, used portions of the first circuit pattern P1 and the second circuit pattern P2 are indicated by solid lines, and unused portions are indicated by broken lines.

In the zone ECU 10A shown in FIG. 2, an upstream power supply line 31 on the vehicle side is connected to a power supply input connector 21. The upstream power supply line 31 supplies the zone ECU 10A with DC power supply power having a voltage of 12 V supplied from the in-vehicle power supply (an in-vehicle battery or the like). The zone ECU 10A and various electrical components connected to a downstream side of the zone ECU 10A are operated by the power supply power.

The control unit 12 performs control for implementing various functions required for the zone ECU 10A by executing a program incorporated in advance by the microcomputer.

The input circuit 13 can process electrical signals input from various sensors, switches, and the like on the vehicle side via the input and output connector 17 and provide the electrical signals to the control unit 12.

The output circuit 14 has a plurality of semiconductor switch circuits built-in, and can control various electrical components connected to a downstream side of the input and output connector 17 as a load in accordance with an electrical signal output by the control unit 12. In addition, the output circuit 14 includes a 12 V corresponding portion 14a and a 48 V corresponding portion 14b. The 12 V corresponding portion 14a controls supply of power supply power to a load that operates at a power supply voltage of 12 V. The 48 V corresponding portion 14b controls supply of power supply power to a load that operates at a power supply voltage of 48 V.

As shown in FIG. 2, power input terminals of the 12V corresponding portion 14a and the 48V corresponding portion 14b are connected to the first circuit pattern P1 and the second circuit pattern P2, respectively. A diode D1 is connected between the first circuit pattern P1 and the second circuit pattern P2. The diode D1 allows energization in a direction from the first circuit pattern P1 toward the second circuit pattern P2, and blocks current in an opposite direction.

That is, when electric power is not supplied to the second circuit pattern P2 from an outside as in the zone ECU 10A of FIG. 2, the power supply power supplied to the first circuit pattern P1 is supplied to input of the 48V corresponding portion 14b via the diode D1 and the second circuit pattern P2.

In addition, the power supply input connector 21, the internal power supply circuit 15, and the three fuse holders 16A to 16C are connected to the first circuit pattern P1.

Terminals at central portions of the fuse holders 16A to 16C are connected to the power supply output connectors 22A to 22C via the first circuit pattern P1. The power supply output connectors 22A, 22B, and 22C are used to supply power supply power having a voltage of 12 V to power supply trunk lines of three systems connected to a downstream side, respectively.

A communication line of the control unit 12 is connected to the communication connector 18 via the first circuit pattern P1. A communication line 32 on the vehicle side is connected to the communication connector 18. Therefore, the control unit 12 of the zone ECU 10A can communicate with other ECUs on the vehicle via the communication connector 18 and the communication line 32.

Configuration Example 2 of Zone ECU

Figure 3:
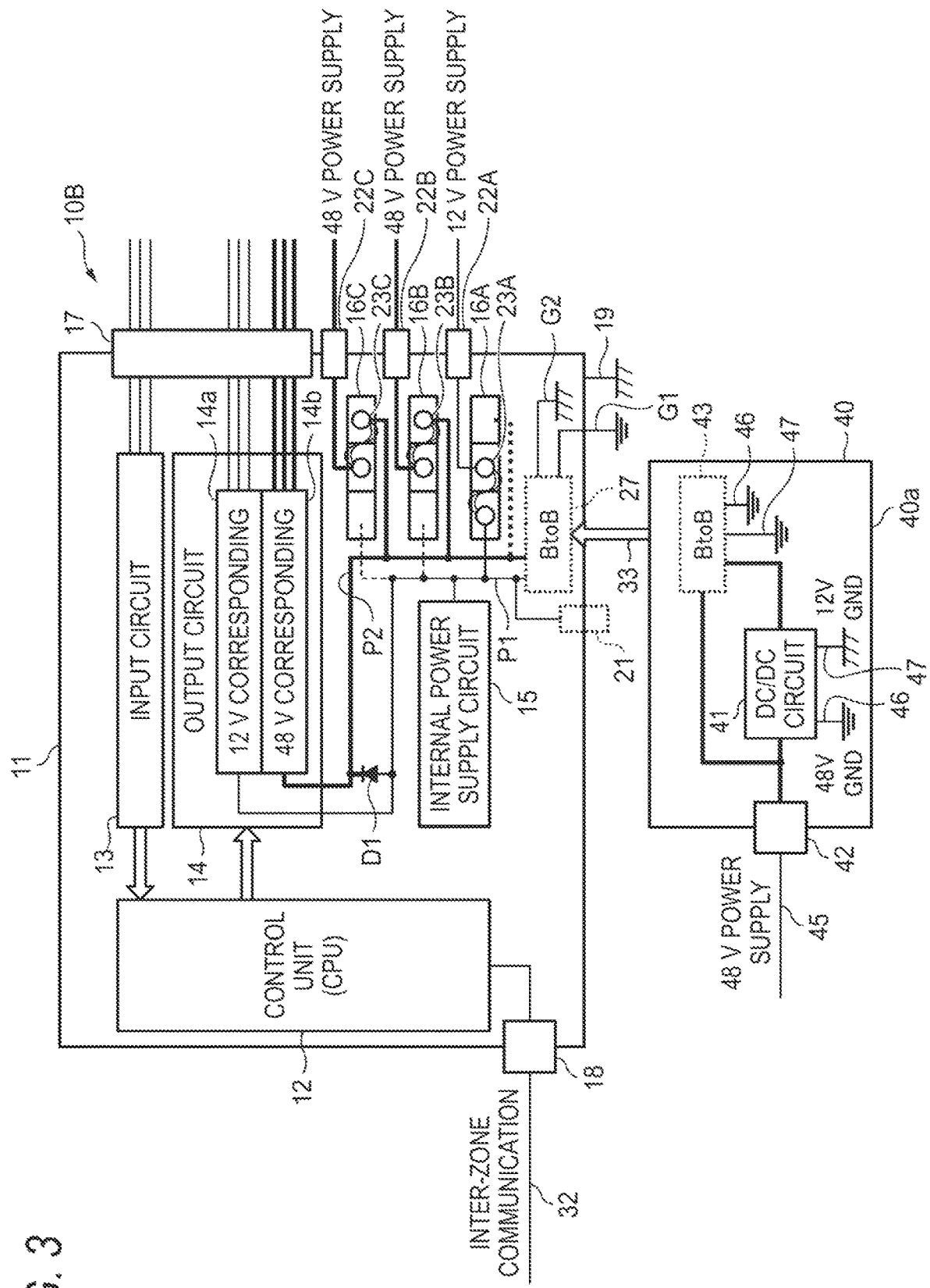
FIG. 3 is a plan view showing a configuration example of a zone ECU for a plurality of power supplies formed of the electrical circuit board.

FIG. 3 shows a configuration example of a zone ECU 10B for a plurality of power supplies formed by using the electrical circuit board 11 shown in FIG. 1. That is, the zone ECU 10B is formed by mounting various electronic components necessary for forming the zone ECU 10B on the electrical circuit board 11 and electrically connecting the electronic components to each other.

Basic functions of the zone ECU 10B shown in FIG. 3 are similar as those of the zone ECU 10A shown in FIG. 2. A large difference between the two types of zone ECUs 10A and 10B is a difference in power supply specifications on the upstream side. That is, in the case of the zone ECU 10A of FIG. 2, the power supply power having a voltage of 12 V is supplied from the upstream power supply line 31 on the vehicle side to the power supply input connector 21, whereas in the case of the zone ECU 10B of FIG. 3, two types of power supply power having voltages of 48 V and 12 V are supplied from output of a DC/DC converter 40 to the inter-board connection portion 27 of the zone ECU 10B via an inter-board connection cable 33.

The DC/DC converter 40 shown in FIG. 3 includes a DC/DC circuit unit 41 that converts power supply power having a voltage of 48 V into power supply power stepped down to 12 V. Elements of the DC/DC circuit unit 41, a connector 42, an inter-board connection portion 43, a 48V ground 46, and a 12V ground 47 are mounted on an electrical circuit board 40a.

When the zone ECU 10B shown in FIG. 3 is mounted on the vehicle, DC power supply power of 48 V is supplied from a predetermined in-vehicle power supply to the connector 42 of the DC/DC converter 40 via a power supply line 45. Then, the power supply power of 48 V input to the DC/DC converter 40 and power supply power of 12 V generated by the DC/DC circuit unit 41 inside the DC/DC converter 40 are output to the inter-board connection cable 33 via the inter-board connection portion 43.

Therefore, in the case of the zone ECU 10B shown in FIG. 3, it is necessary to design the zone ECU 10B so as to receive two types of power supply power of 48 V and 12 V supplied from the inter-board connection cable 33 of the DC/DC converter 40.

In the zone ECU 10B shown in FIG. 3, two types of power supply power can be received from the inter-board connection cable 33 by mounting a component of a predetermined BtoB (Board-to-Board) connector on the inter-board connection portion 27 of the electrical circuit board 11.

In addition, since the first circuit pattern P1 and the second circuit pattern P2 are actually disposed at positions of the inter-board connection portions 27, the power supply power of 12 V is supplied to the first circuit pattern P1 via the inter-board connection cable 33 and the inter-board connection portions 27. In addition, the power supply power of 48 V is supplied to the second circuit pattern P2 via the inter-board connection cable 33 and the inter-board connection portion 27. In addition, the inter-board connection portion 27 is connected to a 48V ground G1 and a 12V ground G2, respectively.

In the zone ECU 10B shown in FIG. 3, the power supply output connectors 22A, 22B, and 22C have a function of supplying power supply power of 12 V, 48 V, and 48 V to power supply lines of the trunk lines of the three systems, respectively.

Therefore, positions in the fuse holders 16B and 16C to which the fuses 23B and 23C are mounted are different between the two types of zone ECUs 10A and 10B. In addition, since the power supply voltages supplied to the trunk lines of the respective systems are different from each other, specifications of currents cut off by the respective fuses 23B and 23C are also changed.

The power supply output connector 22A shown in FIG. 3 is connected to the first circuit pattern P1 via the fuse 23A and the fuse holder 16A. The power supply output connector 22B is connected to the second circuit pattern P2 via the fuse 23B and the fuse holder 16B. The power supply output connector 22C is connected to the second circuit pattern P2 via the fuse 23C and the fuse holder 16C.

In the zone ECU 10B shown in FIG. 3, the power supply power of 12 V is supplied to input of the 12V corresponding portion 14a via the first circuit pattern P1. The power supply power of 48 V is supplied to input of the 48V corresponding portion 14b via the second circuit pattern P2.

In any case, the zone ECU 10A shown in FIG. 2 and the zone ECU 10B shown in FIG. 3 can be manufactured by using the electrical circuit board 11 that is a common component.

Figure 4:
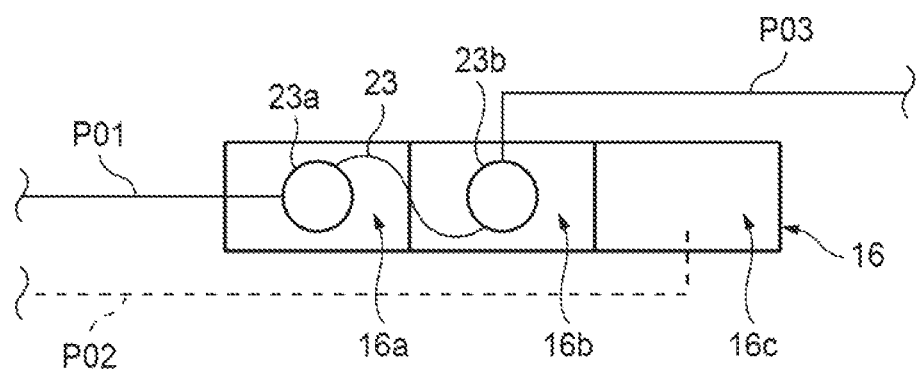
FIG. 4 is a plan view showing a configuration example in the vicinity of a fuse holder.
Figure 5:
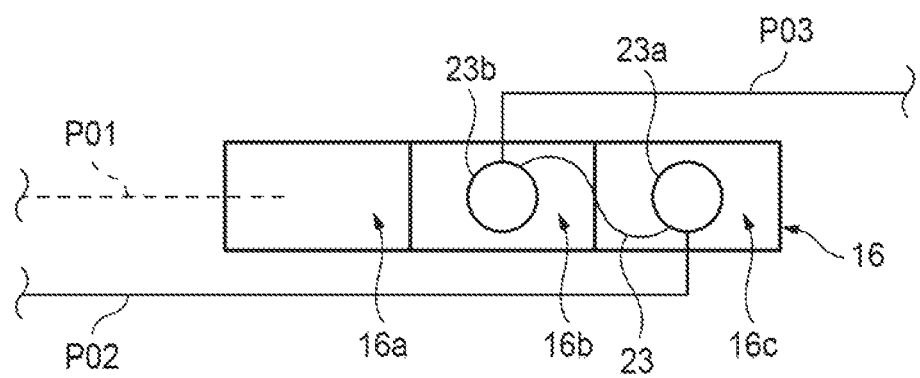
FIG. 5 is a plan view showing a configuration example in the vicinity of the fuse holder.

FIGS. 4 and 5 are plan views showing configuration examples in the vicinity of the fuse holder 16 (16A to 16C). The fuse holder 16 has three in-holder regions 16a, 16b, and 16c arranged in a left-right direction, and has terminals (not shown) for connecting to the fuses 23 in the respective regions.

The fuse 23 can be mounted at a position (first mounting position) in a state of straddling the two in-holder regions 16a and 16b as shown in FIG. 4, or can be mounted at a position (second mounting position) in a state of straddling the two in-holder regions 16b and 16c as shown in FIG. 5.

A terminal of the in-holder region 16a of the fuse holder 16 is connected to a 12 V power supply line of the first circuit pattern P1 in FIGS. 1 to 3 via a circuit pattern P01. A terminal of the in-holder region 16c of the fuse holder 16 is connected to a 48 V power supply line of the second circuit pattern P2 in FIGS. 1 to 3 via a circuit pattern P02. A terminal of the in-holder region 16b of the fuse holder 16 is connected to any one of the power supply output connectors 22A to 22C via a circuit pattern P03.

Therefore, when the fuse 23 is mounted at the first mounting position as shown in FIG. 4, the circuit pattern P01 is connected to any one of the power supply output connectors 22A to 22C via a terminal portion 23a, the fuse 23, a terminal portion 23b, and the circuit pattern P03.

In addition, when the fuse 23 is mounted at the second mounting position as shown in FIG. 5, the circuit pattern P02 is connected to any one of the power supply output connectors 22A to 22C via the terminal portion 23a, the fuse 23, the terminal portion 23b, and the circuit pattern P03.

That is, by changing a mounting position of the fuse 23 in each fuse holder 16 without changing the circuit pattern, a type (12 V or 48 V) of the power supply voltage output to each of the power supply output connectors 22A to 22C on the downstream side can be switched.

Comparative Example

Figure 6:
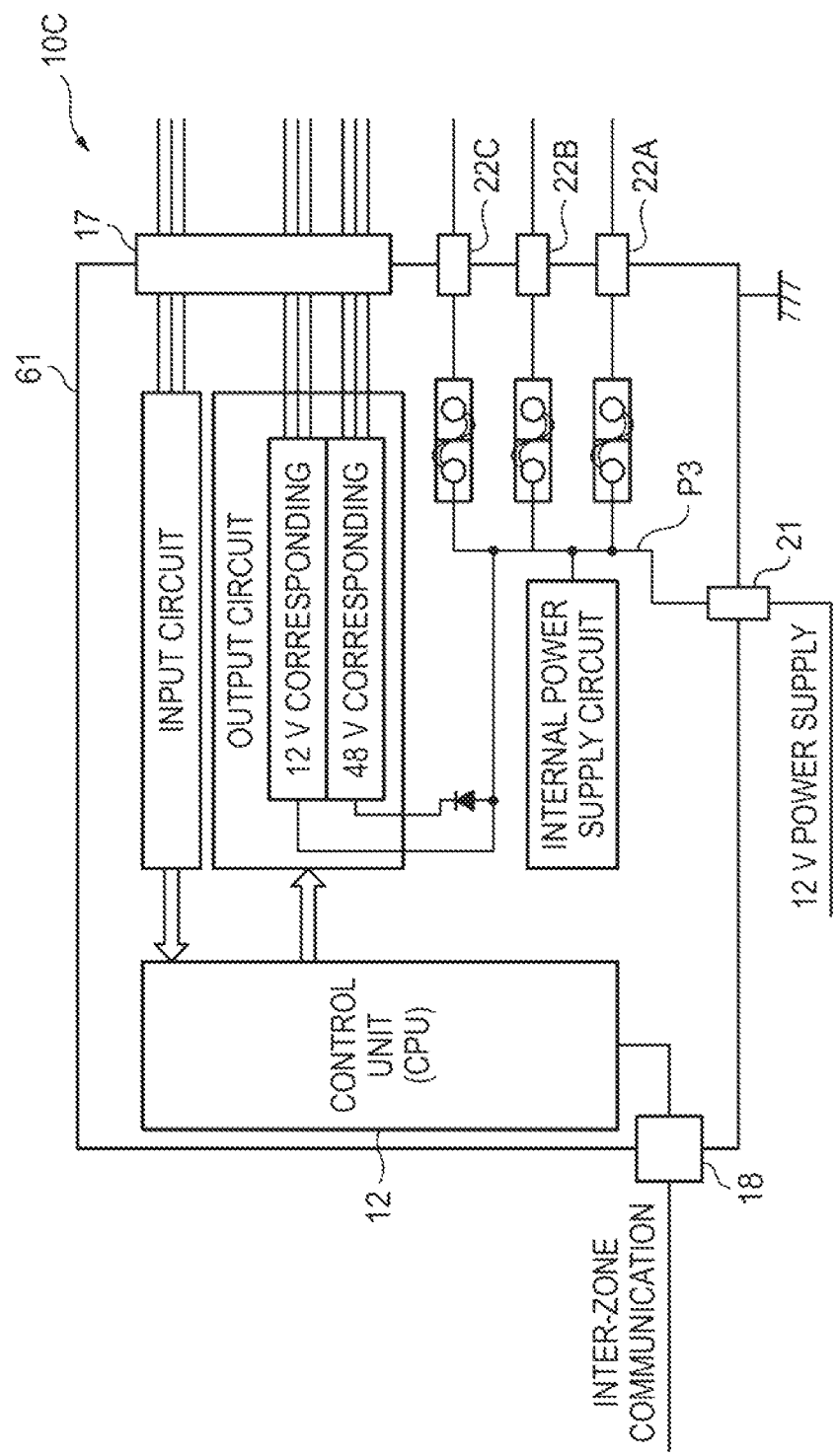
FIG. 6 is a plan view showing a zone ECU according to a comparative example.
Figure 7:
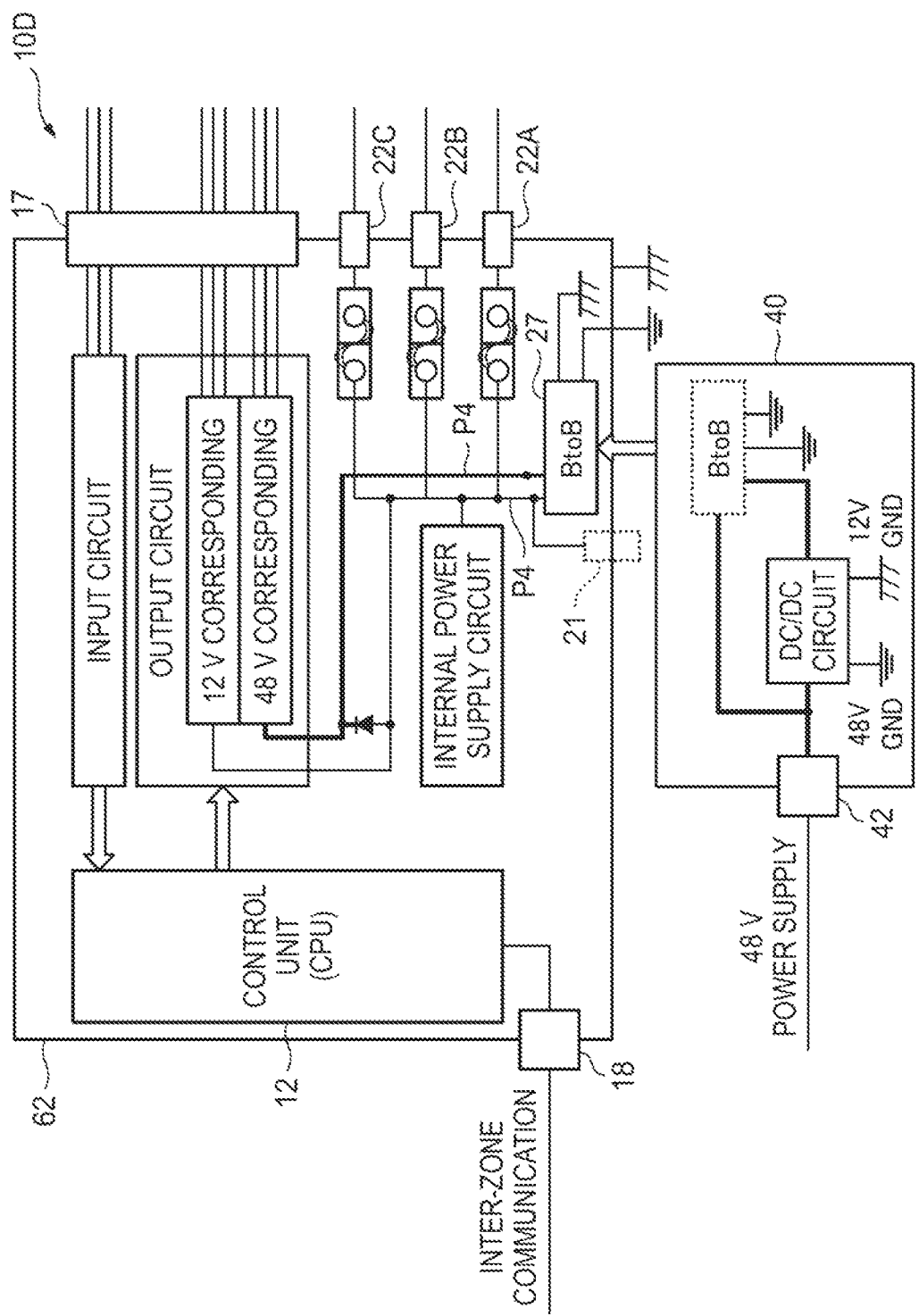
FIG. 7 is a plan view showing a zone ECU according to a comparative example.

FIG. 6 is a plan view showing a zone ECU 10C according to a comparative example. FIG. 7 is a plan view showing a zone ECU 10D according to a comparative example.

Similarly to the zone ECU 10A of FIG. 2, the zone ECU 10C shown in FIG. 6 is designed on the premise that the power supply power of 12 V is supplied from the vehicle side to the power supply input connector 21. However, connection to another board is not assumed, and a possibility that a voltage of 48 V is supplied as the power supply power on the upstream side is not assumed.

Therefore, the zone ECU 10C of FIG. 6 is formed by mounting each component on a dedicated electrical circuit board 61 on which only the circuit pattern P3 dedicated to 12 V is formed.

Similarly to the zone ECU 10B of FIG. 3, the zone ECU 10D shown in FIG. 7 is designed on the premise that the zone ECU 10D is connected to the DC/DC converter 40 by inter-board connection and the power supply power of 48 V and 12 V is respectively supplied from the upstream side.

Therefore, the zone ECU 10D of FIG. 7 is formed by mounting each component on a dedicated electrical circuit board 62 on which only a dedicated circuit pattern P4 corresponding to both the power supply voltages of 48 V and 12 V is formed.

That is, when the zone ECU 10C shown in FIG. 6 and the zone ECU 10D shown in FIG. 7 are manufactured, it is necessary to individually prepare the electrical circuit boards 61 and 62 as dedicated components independent of each other.

As described above, when the electrical circuit board 11 shown in FIG. 1 is used, the electrical circuit board 11 can be used as a common component, and both the zone ECU 10A shown in FIG. 2 and the zone ECU 10B shown in FIG. 3 can be manufactured.

Therefore, when a plurality of types of zone ECUs 10A and 10B having different power supply specifications are manufactured, types and part numbers of the electrical circuit board 11 can be reduced. Accordingly, it is possible to reduce management cost of the part numbers. In addition, since the number of the electrical circuit boards 11 of the same type used is increased, it is possible to reduce a unit price of a component of the electrical circuit boards 11. In addition, when design of the zone ECU or the like is changed, it is not necessary to individually design each power supply specification, and development man-hours can be reduced.

When the fuse holder 16 capable of selectively changing the mounting position of the fuse 23 is mounted on the electrical circuit board 11 as shown in FIGS. 2 and 3, the voltage of the power supply power supplied to the downstream side of each of the power supply output connectors 22A to 22C can be switched only by changing the mounting position of the fuse 23. Therefore, it is easy to cope with a change of a specification of the power supply voltage.

In the embodiment described above, a case of the electrical circuit board 11 used for manufacturing the zone ECUs 10A and 10B is assumed, but the electrical circuit board of the present invention can be used for various types of electrical components mounted on the vehicle and various electrical components used in that other than the vehicle.

Here, features of the electrical circuit board according to the embodiment of the present invention described above will be briefly summarized and listed in the following [1] to [5].

[1] An electrical circuit board (11) on which an electronic component forming an electronic control unit (zone ECU 10A or 10B) disposed between an upstream power supply and a downstream power supply trunk line is mounted, the electrical circuit board (11) including:
   a first circuit pattern (P1) that forms an electrical circuit corresponding to a single power supply voltage of the upstream power supply;
   a second circuit pattern (P2) that forms an electrical circuit corresponding to a plurality of power supply voltages of the upstream power supply;

a single power supply connection portion (power supply input connector 21) corresponding to connection with an external circuit that supplies the upstream power supply; and an inter-board connection portion (27) corresponding to inter-board connection with another circuit board that supplies the upstream power supply.

According to the electrical circuit board having a configuration of the above [1], the first circuit pattern can be used to form a first electrical circuit corresponding to the single power supply voltage, and the second circuit pattern can be used to form a second electrical circuit corresponding to a plurality of power supply voltages. That is, a common circuit board can be used as it is in both a case where the first electrical circuit is formed and a case where the second electrical circuit is formed. Therefore, it is possible to reduce the types and the part numbers of the circuit board, and it is possible to reduce management cost. In addition, since the common circuit board can be used in a plurality of types of devices, it is possible to reduce a unit price of the circuit board by increasing a quantity. In addition, it is possible to reduce the development man-hours when a circuit change is required.

[2] The electrical circuit board according to [1], further including:

one or more fuse holders (16) on which a predetermined fuse that cuts off power supply power supplied to the downstream power supply trunk line is mounted, in which the fuse holder has a first mounting position (see FIG. 4) at which the fuse is connectable to the first circuit pattern and a second mounting position (see FIG. 5) at which the fuse is connectable to the second circuit pattern.

According to the electrical circuit board having a configuration of the above [2], it is possible to implement a function of cutting off a current of any one of a plurality of circuits having different power supply voltages to be handled by changing the mounting position of the fuse by using the common fuse holder. Therefore, when a specification of the power supply voltage to be output to a load side is switched, it is not necessary to replace components of the fuse holder.

[3] The electrical circuit board according to [2], in which the first mounting position and the second mounting position of the fuse holder are disposed at adjacent positions in a state where the first mounting position and the second mounting position partially overlap each other (see FIGS. 4 and 5).

According to the electrical circuit board having a configuration of the above [3], since the first mounting position and the second mounting position are disposed at the adjacent positions in a state where the first mounting position and the second mounting position partially overlap each other, it is possible to provide a function for switching a plurality of circuits without increasing a size of an outer shape of the fuse holder too much.

[4] The electrical circuit board according to [2] or [3], further including:

a plurality of the fuse holders (16A to 16C) independent of each other; and a plurality of trunk line connection portions (power supply output connectors 22A to 22C) that connect to the downstream power supply trunk line, in which each of the plurality of trunk line connection portions is connectable to the fuse holders different from each other.

According to the electrical circuit board having a configuration of the above [4], current flowing through each of the plurality of power supply lines of the trunk lines connected to the downstream side can be individually cut off by the fuse mounted on each of the plurality of fuse holders. In addition, it is possible to supply power supply power having voltages different from each other to a plurality of independent power supply lines.

[5] The electrical circuit board according to any one of [1] to [4], further including:

an input circuit portion (input circuit 13) configured to input a signal from an outside;

an output circuit portion (output circuit 14) configured to output a signal to the outside;

a control unit (12) configured to control a function of the board; and a communication line connection portion (communication connector 18) configured to communicate with an outside of the board.

According to the electrical circuit board having a configuration of the above [5], it is possible to easily implement an electronic control unit having various functions by using the input circuit portion, the output circuit portion, the control unit, and the communication line connection portion.

What is claimed is:

1. An electrical circuit board on which an electronic component having an electronic control unit disposed between an upstream power supply and a downstream power supply trunk line is mounted, the electrical circuit board comprising:

a first circuit pattern that forms an electrical circuit corresponding to a single power supply voltage of the upstream power supply;

a second circuit pattern that forms an electrical circuit corresponding to a plurality of power supply voltages of the upstream power supply;

a single power supply connection portion corresponding to connection with an external circuit supplying the upstream power supply; and an inter-board connection portion corresponding to inter-board connection with another circuit board supplying the upstream power supply.

2. The electrical circuit board according to claim 1, further comprising:

one or more fuse holders on which a predetermined fuse cutting off power supply power supplied to the downstream power supply trunk line is mounted, wherein the fuse holder has a first mounting position at which the fuse is connectable to the first circuit pattern and a second mounting position at which the fuse is connectable to the second circuit pattern.

3. The electrical circuit board according to claim 2, wherein the first mounting position and the second mounting position in the fuse holder are disposed at adjacent positions in a state where the first mounting position and the second mounting position partially overlap each other.

4. The electrical circuit board according to claim 2, further comprising:

a plurality of the fuse holders independent of each other; and a plurality of trunk line connection portions that connect to the downstream power supply trunk line, wherein each of the plurality of trunk line connection portions is connectable to the fuse holders different from each other.

5. The electrical circuit board according to claim 1, further comprising:
- an input circuit portion configured to input a signal from an outside;
- an output circuit portion configured to output a signal to an outside;
- a control unit configured to control a function of the electrical circuit board; and
- a communication line connection portion configured to communicate with an outside of the electrical circuit board.

* * * * *